United States Patent [19]

Sakai et al.

[11] 4,158,179
[45] Jun. 12, 1979

[54] AMPLIFIER CIRCUIT

[75] Inventors: Kazumasa Sakai; Tatsuhiko Okuma, both of Tokyo, Japan

[73] Assignee: Trio Kabushiki Kaisha, Tokyo, Japan

[21] Appl. No.: 788,993

[22] Filed: Apr. 19, 1977

[30] Foreign Application Priority Data

Apr. 19, 1976 [JP] Japan .................................. 51-44560
Apr. 19, 1976 [JP] Japan .................................. 51-44561

[51] Int. Cl.² ............................................. H03F 3/04
[52] U.S. Cl. .................... 330/297; 330/199; 330/296
[58] Field of Search ............... 330/199, 296, 297, 310

[56] References Cited

U.S. PATENT DOCUMENTS

| | | | |
|---|---|---|---|
| 3,320,551 | 5/1967 | Miller | 307/310 X |
| 3,577,092 | 5/1971 | Kubicz | 330/296 X |
| 3,596,199 | 7/1971 | Hafler | 330/296 X |
| 3,961,280 | 6/1976 | Sampei | 330/297 X |
| 3,968,451 | 7/1976 | Kamimura et al. | 330/297 X |

Primary Examiner—Lawrence J. Dahl
Attorney, Agent, or Firm—Lane, Aitken & Ziems

[57] ABSTRACT

An amplifier circuit having an input adapted to receive a signal to be amplified from a signal source, at least two sets of combined amplifying transistors and associated power sources for the amplifying transistors, the two sets constituting first and second amplifying stages, a switching transistor for automatically switching the amplifying operation of the amplifier circuit from the first amplifying stage to the second amplifying stage depending upon the amplitude of the input signal to the amplifier and a load to which the amplifying transistors are connected in parallel.

11 Claims, 13 Drawing Figures

FIG. IA
FIG. IB
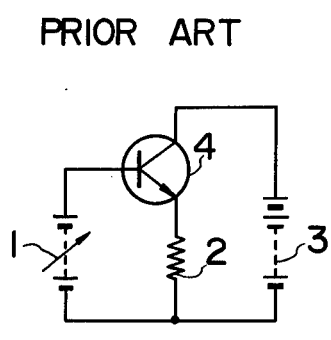
PRIOR ART
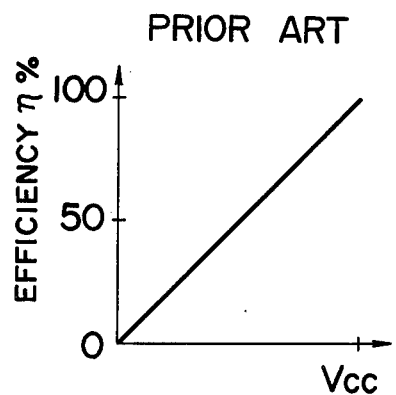
PRIOR ART
INPUT SIGNAL
VOLTAGE

FIG. 2A
FIG. 2B
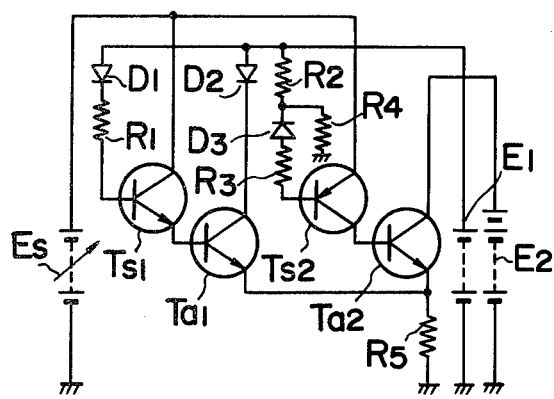
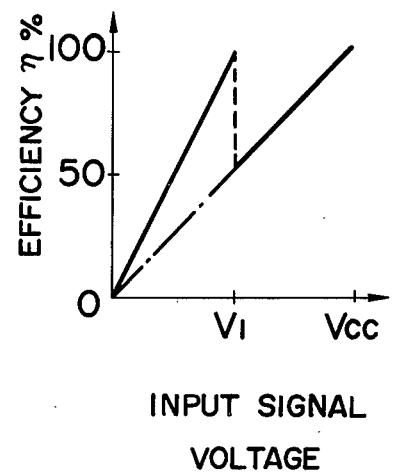
INPUT SIGNAL VOLTAGE
FIG. 3A
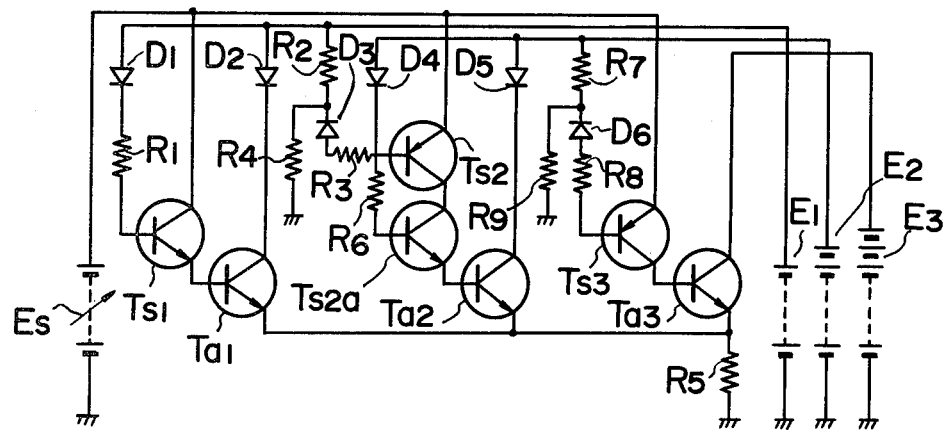

INPUT SIGNAL VOLTAGE

INPUT SIGNAL VOLTAGE

INPUT SIGNAL VOLTAGE

AMPLIFIER CIRCUIT

BACKGROUND OF THE INVENTION

The present invention relates to an amplifier circuit and more particularly to an amplifier circuit appropriate for an output circuit of an amplifying system.

Conventionally, a class B type amplifier circuit is often used as the output circuit of an amplifying system. Because the class B type amplifier has a good efficiency as compared to a class A type amplifier, relatively little heat is produced in operation and it is, therefore, preferred when relatively large power output is required from an amplifier. The maximum efficiency of a class B type amplifier, however, usually does not exceed 70%. Maximum efficiency is usually realized at maximum output and efficiency decreases as the output decreases. However, during normal operation, an amplifier usually operates at much lower output than maximum most of the time. Therefore, when a large output amplifier is required, the heat evolved is large even if a class B type amplifier is used. Thus, it is necessary to design effective means to dissipate the heat which is generated. This design problem is difficult, and in the case of an integrated circuit output amplifier, the heat generation and dissipation problem restricts the permissible maximum amplifier output.

A proposal for solving the problem is disclosed in U.S. Pat. No. 3,961,280 wherein an amplifier circuit is shown including a switching transistor and an amplifying transistor, both being connected in series in the collector to emitter circuits thereof. A switching transistor switches a power supply from one amplifying transistor to another in accordance with the input signal. Considering the circuit construction, when the number of the switching transistors used is increased, the current capacities of the transistors must be correspondingly large due to the series connection.

SUMMARY OF THE INVENTION

Accordingly, a primary object of the present invention is to provide an amplifier circuit for an output circuit of an amplifying system wherein the efficiency, particularly in the low input voltage range is considerably improved, thereby eliminating the excessive heat generation and dissipation problem.

Another object of the present invention is to provide an amplifier circuit for an output circuit of an amplifying system wherein transistors having relatively small current capacities may be used even when the number of the amplifying stages is large.

Still another object of the present invention is to provide an amplifier circuit for an output circuit of an amplifying system suitable for use in an integrated circuit device.

The present invention may be briefly summarized as involving an amplifier circuit comprising an input adapted to receive a signal to be amplified from a signal source; at least two sets of combined amplifying elements and associated power sources, one of the two sets constituting a first stage and one constituting a succeeding stage; switching means for switching the amplifying operation from one of the amplifying circuits of the sets of combined amplifying elements and its associated power source to another depending upon the amplitude of the input signal, the respective amplifying elements and associated power sources being connected in parallel to a load.

Other objects and features of the present invention will be apparent from the following description taken in connection with the accompanying drawings.

BRIEF DESCRIPTION OF THE DRAWINGS

FIG. 1A is a circuit diagram of a conventional amplifier and FIG. 1B is a graph showing the efficiency of the FIG. 1A circuit;

FIG. 2A is a circuit diagram of an embodiment of an amplifier circuit according to the present invention, and FIG. 2B is a graph showing the efficiency of the circuit of FIG. 2A;

FIG. 3A is a circuit diagram of a modification of the circuit of FIG. 2A.

DESCRIPTION OF THE PREFERRED EMBODIMENTS

Figure 3B:
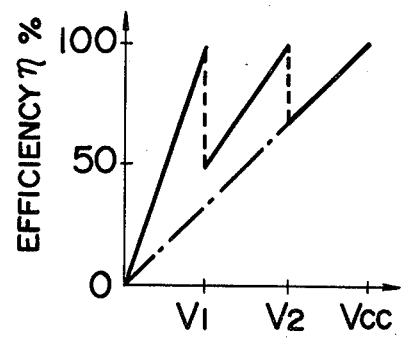
FIG. 3B is a graph illustrating the efficiency of the modification of FIG. 3A.

Before proceeding with the description of the embodiments of the amplifier circuits according to the present invention, the prior art amplifier circuit of FIG. 1A will be briefly discussed. The conventional amplifier circuit as shown in FIG. 1A has a transistor 4 which has its base connected to an input signal source 1, its emitter connected to a load 2, and its collector connected to a power source 3.

The efficiency of an amplifier of this type is generally considered to be the ratio of the power output of the amplifier consumed or available at the load to the power supplied to the amplifier from the power source. For amplifier circuits of the type being considered herein, it is convenient to define a measure of efficiency, $\eta$, as follows:

$$\eta = \frac{\text{Input signal voltage } (V_i)}{\text{Power source voltage } (V_{cc})} \quad (1)$$

The relationship between this efficiency measure $\eta$ and the input signal voltage $V_i$ is shown graphically in FIG. 1B. As seen from FIG. 1B, the measure of efficiency increases linearly as the input signal voltage approaches the voltage $V_{cc}$ of the power source. As previously mentioned, conventional amplifiers of the type shown in FIG. 1A typically are used with average input signal voltages which are relatively small compared to $V_{cc}$. Accordingly, this results in relatively low average efficiency and the heat dissipation problem due to the relatively low efficiency is unavoidable.

FIG. 2A shows an embodiment of an amplifier circuit according to the present invention. A signal source Es is grounded at one terminal and connected at the other terminal to the collector of a transistor Ts1 and to the emitter of a transistor Ts2. The base of the transistor Ts1 is connected through a resistor R1 and a unidirectional element such as a diode D1 to the positive side of a first power source E1. The emitter of the transistor Ts1 is connected to the base of a transistor Ta1. The collector of the transistor Ta1 is also connected to the positive side of the power source E1 through a diode D2. The emitter of the transistor Ta1 is connected to one terminal of a resistor R5. In operation, the transistor Ts1 serves as a switching element, the transistor Ta1 serves as an amplifying element, and the resistor R5 represents a load for the amplifier circuit. The base of the transistor Ts2 which also serves as a switching element is connected to the positive side of the power source E1 through a series combination of resistors R2 and R3 and a unidirectional element such as a diode D3. The connection point between the resistor R2 and the cathode of the diode D3 is connected to one terminal of a resistor R4 which has its other terminal grounded. The collector of the switching transistor Ts2 is connected to the base of a transistor Ta2. The transistor Ta2 which serves as an amplifying element has its collector terminal connected to the positive side of a second power source E2 and its emitter terminal connected to the ungrounded terminal of the load resistor R5.

In the amplifier circuit in FIG. 2A, a diode (not shown) may be inserted between the collector of the second amplifying transistor Ta2 and the positive side of the second power source E2. The diode D1 is used to prevent current from the signal source Es from flowing through the collector and base of the first switching transistor Ts1 into the first power source E1 when the input signal Vi exceeds the first power source voltage. The diode D2 likewise prevents current from the signal source from flowing through the collector to emitter circuit of the first switching transistor Ts1 and the base to collector circuit of the first amplifying transistor Ta1 into the first power souce E1. The resistors R2 and R4 are provided to bias the second switching transistor Ts2 so that it will become conductive at a different operating point for a given input signal voltage and so that both of the switching transistors Ts1 and Ts2 will not be non-conductive simultaneously during normal operation. The resistors R2 and R4 are selected so that sometimes both of the transistors Ts1 and Ts2 are conductive simultaneously and so that the output signal across the load R5 will not be distorted due to the simultaneous non-conduction of the transistors Ts1 and Ts2. The simultaneous conduction of the transistors Ts1 and Ts2 causes no special problems. The voltage V1 of the first power source E1 is selected to be lower than that of the voltage, Vcc, of the second power source E2.

The following is a description of the operation of the amplifier circuit shown in FIG. 2A. Assume first that an input signal of input signal voltage Vi is provided from the input signal source Es to the collector of the first switching transistor Ts1 and the emitter of the second switching transistor Ts2, and that the input signal voltage Vi is lower than the voltage V1 of the first power source E1. At this time, the voltage V1 of the first power source E1 suitably biases the base of the transistor Ts1, through the diode D1 and the bias setting resistor R1 so that the transistor Ts1 is conductive. Accordingly, the input signal Vi is applied to the base of the first amplifying transistor Ta1 through the collector to emitter circuit of the transistor Ts1, thereby turning on the first amplifying transistor Ta1. The conduction of the transistor Ta1 results in output current through the load R5 from the first power source E1 through the diode D2 and the collector to emitter circuit of the first amplifying transistor Ta1. On the other hand, at this time the second switching transistor Ts2 is non-conductive because the diode D3 is reverse biased and non-conductive, thereby interrupting the supply of bias current to the base of the second switching transistor Ts2. The non-conduction of the transistor Ts2 makes the second amplifying transistor Ta2 non-conductive. Thus, the measure of efficiency of the amplifying circuit is given by the equation (2)

$$\text{Efficiency } \eta = Vi/V1 \tag{2}$$

Now, let us consider the case where the input signal Vi exceeds the voltage V1 of the first power source E1 but is less than the voltage Vcc of the second power source E2. In this case, the diode D3 is forward biased and conductive and the bias setting resistor R3 and its associated resistors R2 and R4 suitably bias the second switching transistor Ts2 to turn on Ts2 to its conductive state. The conduction of the transistor Ts2 permits the input signal Vi from the signal source Es to pass through the emitter to collector circuit of the transistor Ts2 to the base of the second amplifying transistor Ta2. Upon receipt of the bias current from the transistor Ts2, the transistor Ta2 is turned on so that output current is provided through the load R5 from the second power source E2 through the collector to emitter circuit of the second amplifying transistor Ta2. At this time, the emitter potential of the first switching transistor Ts1 is higher than the input voltage Vi from the input signal source Es so that the first switching transistor Ts1 is turned off and the first amplifying transistor Ta1 is similarly turned off. Accordingly, the measure of efficiency $\eta$ of this amplifier circuit is given by the equation (3)

$$\eta = Vi/Vcc \tag{3}$$

In short, when the input signal Vi is lower than the voltage V1 of the first power source, the first switching transistor Ts1 operates to drive the first amplifying transistor Ta1 so that power from the first power source E1 is provided to the load R5. As the input signal Vi increases to the voltage range between the voltages V1 and Vcc, the second switching transistor Ts2 operates to turn on the second amplifying transistor Ta2 so that power from the second power source E2 is provided to the load R5.

FIG. 2B illustrates the relationship between the measure of efficiency $\eta$ and the input signal voltage. In FIG. 2B the alternate long and short dashed line indicates the efficiency characteristic of a conventional amplifier circuit such as shown in FIGS. 1A and 1B. In FIG. 2B, however, the linear curve rising at the steeper angle in the input voltage range from 0 to V1 indicates the measure of efficiency when the first amplifying transistor Ta1 is operating. The linear curve rising along the conventional one in the input voltage range from V1 to Vcc indicates the measure of efficiency when the second amplifying transistor Ta2 is operating. FIG. 2B shows that the efficiency of the amplifier circuit of FIG. 2A at low input signal voltages is remarkably improved as compared to the efficiency of a conventional amplifier circuit.

FIG. 3A illustrates another embodiment of the amplifier circuit according to the present invention. In FIG. 3A like reference numerals are used to designate like or equivalent elements appearing in other figures in the various drawings. As compared to the amplifying circuit of FIG. 2A which employs only two sets of combined amplifying elements and their associated power sources, the amplifying circuit of FIG. 3A uses three sets of combined amplifying elements and their associated power sources. As seen from FIG. 3A an additional amplifying transistor Ta3 and a third power source E3 is used with an additional switching transistor Ts3 and its associated components, including a bias setting resistor R8, resistors R7 and R9 for adjusting the switching point of the third switching transistor Ts3 with respect to the other ones, and a diode D6 for preventing flow of current from the signal source Es to the power source E2 as previously described.

Additionally, the switching circuitry associated with the second set of combined amplifier elements including transistor Ta2, has been modified. In this set of amplifying elements, to switching transistors, Ts2 and Ts2a, are now used. These two switching transistors are effectively connected in series so that both must be in the conductive state in order for the input signal voltage Vi to be, provided to the base of amplifying transistor Ta2. The transistor Ts2 of FIG. 3A is connected to the first power source E1 as is the second switching transistor Ts2 in FIG. 2A, with the base of Ts2 being connected to the first power source E1 through a biasing circuit of resistors R2, R3, and R4 and a unidirectional element D3. The base of transistor Ts2a is connected to the second power source E2 through a biasing resistor R6 and a unidirectional element D4. In this example, the voltage V1 of the first power source E1 is lower than the voltage V2 of the second power source E2, and the voltage V2 is lower than the voltage Vcc of the third power source E3.

In operation, when the input signal voltage Vi is less than the voltage V1 the first switching transistor Ts1 is turned on and the first amplifying transistor Ta1 becomes conductive, with the previously described result that output current is provided to the load R5 from the first power source E1 through the diode D2 and the collector to emitter circuit of the transistor Ta1. At this time, the switching transistor Ts2a is also in a conductive condition but the other two switching transistors Ts2 and Ts3 are in non-conductive conditions due to the reverse biasing of the directional elements D3 and D6. Because Ts2 and Ts3 are non-conductive, the amplifying transistors Ta2 and Ta3 are non-conductive.

When the input signal voltage Vi enters the voltage range from V1 to V2, the two switching transistors Ts2 and Ts2a become conductive, thereby resulting in amplifying transistor Ta2 being conductive. On the other hand, the switching transistors Ts1 and Ts3 are non-conductive and the related amplifying transistors Ta1 and Ta3 are non-conductive. Therefore, output current from the second power source E2 is provided to the load R5, through the amplifying transistor Ta2 and the diode D5.

When the input signal Vi is higher than the voltage V2 but lower than the voltage Vcc of the third power source E3, the switching transistor Ts3 is turned on and the amplifying transistor Ta3 is conductive. At the same time the other switching transistors Ts1 and Ts2a are turned off, thereby causing amplifying transistors Ta1 and Ta2 to be non-conductive. Therefore, the third amplifying transistor Ta3 alone effects the amplifying operation by providing output current through the load resistor R5 from the third power source E3.

In this amplifier circuit, an additional diode (not shown) may be inserted between the collector of the third amplifying transistor Ta3 and the third power source E3. The efficiency curve of the amplifier circuit of FIG. 3A as a function of the input voltage Vi is shown in FIG. 3B. As shown, the first stage amplifying transistor Ta1 improves the measure of efficiency for an input signal voltage in the range from 0 to V1 and the second stage amplifying transistor Ta2 improves the measure of efficiency for an input signal voltage in the range from V1 to V2.

Figure 4:
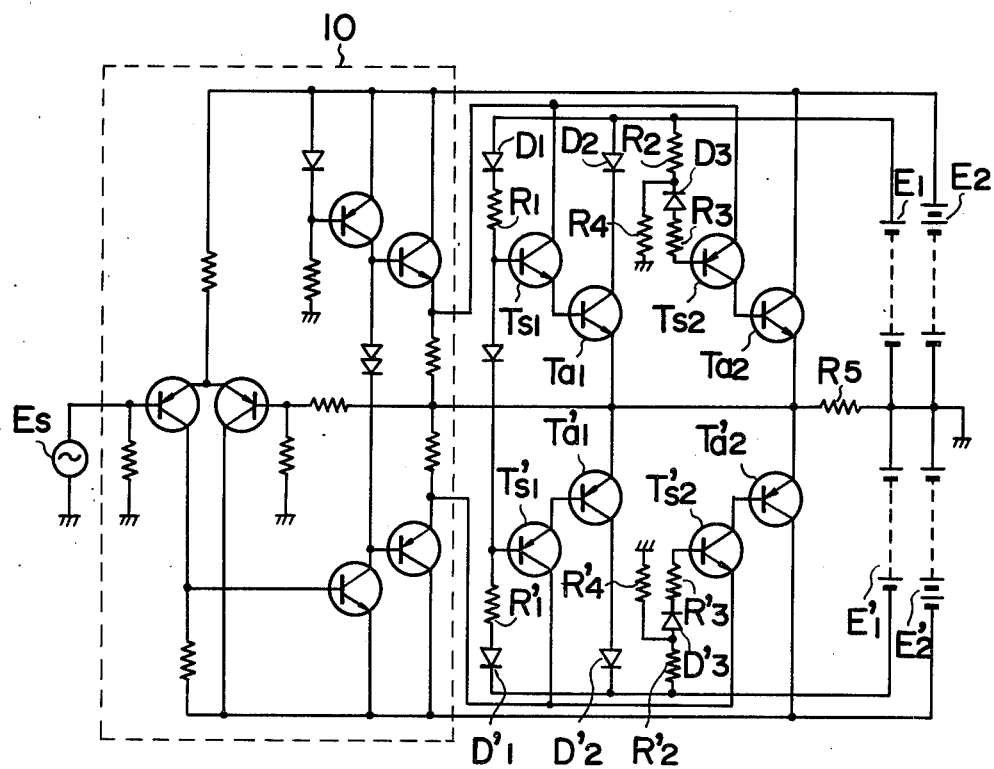
FIG. 4 is a circuit diagram of another modification of the circuit of FIG. 2A.

FIG. 4 illustrates another embodiment of the basic amplifier circuit according to the present invention wherein the basic amplifier circuit is wired in as part of a push-pull amplifier. In FIG. 4 reference numeral 10 designates generally a conventional drive circuit for driving the push-pull amplifier which includes the basic amplifier circuits according to the present invention. The overall push-pull amplifier circuit comprises two amplifying stages corresponding generally to the two stages of the basic amplifier circuit shown in FIG. 2A together with the complemental amplifier circuits necessary for push-pull operations; the circuit comprising transistors Ts1 and Ta1 and their associated components R1, D1 and D2 and the circuit comprising transistors Ts1' and Ta1' and their associated components R1', D1' and D2' are connected complementally and constitute a first amplifying stage. The circuit including transistors Ts2 and Ta2 and their associated components R2 to R4 and D3 and the other circuit including transistors Ts2' and Ta2' and their associated components R2' to R4' and D3' are likewise connected complementally and constitute the second amplifying stage. The operation of this overall amplifier circuit is performed in the well-known push-pull mode with the advantages inherent to the push-pull type amplifier and with the additional advantages inherent in the present invention.

Figure 5A:
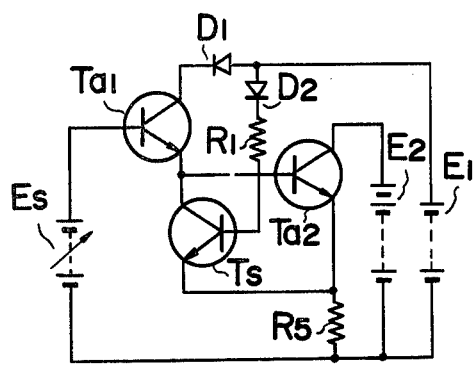
FIG. 5A is a circuit diagram of another embodiment of the amplifying circuit of the present invention.

FIG. 5A shows another embodiment of the amplifier circuit of the present invention in which the signal source Es is connected directly to the base of the amplifying transistor Ta1. The amplifying transistor Ta1 can, in certain modes of operation, directly amplify the input signal voltage Vi provided by the signal source Es. The collector of the transistor Ta1 is connected with the positive side of the first power source E1 through a diode D1. The emitter of the transistor Ta1 is connected to the collector of a switching transistor Ts which serves as a switching element. The base of the transistor Ts is connected to the positive side of the first power source E1 through a diode D2 and a resistor R1. The resistor R1 is a bias setting resistor selected to bias the transistor Ts so that the transistor Ts is turned on when the input voltage Vi is lower than the voltage V1 of the first power source E1 and so that transistor Ts is turned off when the input voltage Vi is in the voltage range from V1 to Vcc. The emitter of the transistor Ts is connected with one terminal of a load resistor R5. The base of a transistor Ta2 is connected to both the emitter of the transistor Ta1 and the collector of the transistor Ts. The transistor Ta2 operates as an amplifying element in operation when the switching transistor Ts is in the non-conductive state, i.e., turned off. The collector of transistor Ta2 is connected to the positive side of the second power source E2. The emitter of transistor Ta2 is connected to the load resistor R5. The negative sides of the signal source Es and the respective power sources E1 and E2 and the other terminal of the load resistor R5 are commonly connected. The diode D1 is used to prevent current from flowing from the signal source Es through the base to the collector path of the transistor Ta1 into the power source E1 when the input signal voltage Vi exceeds the voltage V1 of the first power source E1. The diode D2 is also used to prevent current from flowing from the signal source Es to the power source E1 under the same condition. Although not shown, a diode may also be inserted between the collector of the transistor Ta2 and the positive side of the second power source E2 for the same purpose. The voltage V1 of the power source E1 is set lower than that Vcc of the second power source E2.

In operation, when the input signal Vi is lower than the voltage V1 of the first power source E1, the transistor Ts is in the conductive state (i.e., turned on) due in part to the selection of the bias setting resistor R1 and the input signal Vi at the base of the transistor Ta1 which causes the amplifying transistor Ta1 to conduct and provide output current through the load resistor R5. The output current through the load resistor R5 is provided by the first power source E1 through the diode D1, the collector to emitter circuit of the transistor Ta1 and the collector to emitter circuit of the transistor Ts. At this same time, the amplifying transistor Ta2 is turned off because its base to emitter circuit is effectively short-circuited by the collector to emitter circuit of the transistor Ts. Accordingly, the measure of efficiency $\eta$ is given by $$\eta = Vi/V1 \qquad (4)$$

Figure 5B:
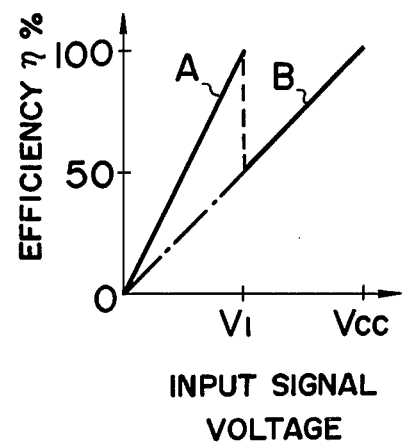
FIG. 5B is a graph showing the efficiency obtained by the circuit of FIG. 5A.

The measure of efficiency as a function of the input voltage Vi is graphically traced in FIG. 5B. In FIG. 5B the continuous line A indicates the efficiency for Vi in the range of 0 to V1. The alternate long and short dashed line in FIG. 5B indicates the efficiency characteristic of the conventional amplifier circuit for the same input voltage range. Because the slope of the line A is steeper in the low input signal range than the line for a conventional amplifier circuit, it is seen that the above-mentioned operation of the transistor Ta1 remarkably improves the efficiency of the amplifier circuit in the low input signal voltage range.

When the input signal voltage Vi exceeds the voltage V1 but is less than the voltage Vcc of the second power source E2, a voltage is developed across the load resistor R5 as a result of current from the second power source through the collector to emitter circuit of the transistor Ta2. This voltage caused the switching transistor Ts to become reverse biased, thereby switching to its non-conductive (i.e., turned off) state. As a result, the input signal Vi is applied to the base of the transistor Ta2 through the base to emitter circuit of the transistor Ta1. Accordingly, the output current through the load resistor R5 is obtained from the second power source E2 through the collector to emitter circuit of the transistor Ta2. At this same time, the potential at the emitter of the transistor Ta1 increases to be higher than the voltage V1 so that no current flows through the collector to emitter circuit of the transistor Ta1. The transistor Ta1 therefore operates merely as a unidirectional element permitting the current to pass through the base to emitter circuit thereof to the base of the transistor Ta2. Accordingly, the measure of efficiency $\eta$ of the amplifier circuit during this mode of operation is given $$\eta = Vi/Vcc \qquad (5)$$

The graphical expression of this efficiency as a function of the input voltage Vi is shown in FIG. 5B, and indicated by a continuous line B for Vi in the range of V1 to Vcc.

Figure 6A:
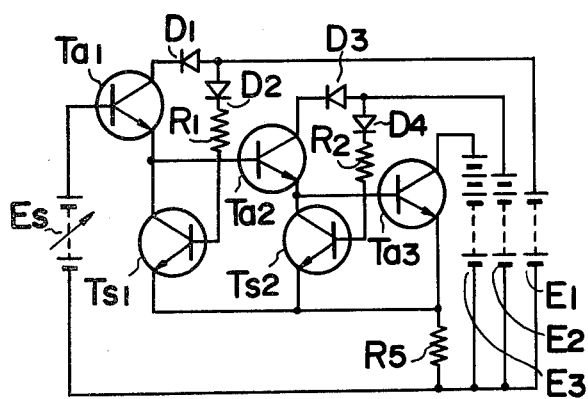
FIG. 6A is a circuit diagram of a modification of the circuit of FIG. 5A

FIG. 6A illustrates a modification of the amplifier circuit of FIG. 5A. In FIG. 6A three amplifying transistors Ta1, Ta2 and Ta3 and three power sources E1, E2 and E3 are used. Two switching transistors Ts1 and Ts2 are used to switch the mode of operation of the amplifying circuit to the combination of amplifier elements including the first power source and the first amplifying transistor Ta1, to the combination of amplifier elements including the second power source E2 and the second amplifying transistor Ta2, or to a combination of amplifier elements including the third power source E3 and the amplifying transistor Ta3, depending on the input signal voltage Vi. The additional components in this circuit as compared to the circuit in FIG. 5A include the switching transistor Ts2 and its associated components R2 and D4 connected in series between the base of the transistor Ts2 and the second power source E2, a diode D3 for preventing reverse current, and the transistor Ta3 for supplying output current to the load resistor R5 from the third power source E3 depending upon the mode of operation. As in the previous case, another diode (not shown) may be inserted between the collector of the transistor Ta3 and the third power source E3.

Figure 6B:
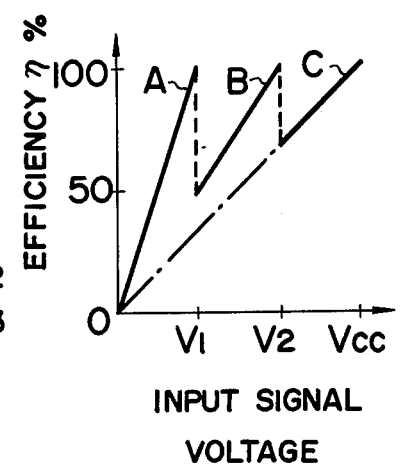
FIG. 6B is a graph showing the efficiency obtained by the modification of FIG. 6A.

The measure of efficiency characteristic of this amplifier circuit as a function of the input voltage Vi is shown in FIG. 6B. The first amplifying stage which includes the combination of the amplifying transistor Ta1 and the first power source E1 exhibits its efficiency as indicated in the continuous line A for an input voltage Vi in the range of 0 to V1. The second amplifying stage which includes the combination of the amplifying transistor Ta2 and power source E2 is switched into operation for an input voltage Vi in the range of V1 to V2 and has the efficiency shown by the continuous line B in FIG. 6B. The continuous line C indicates the efficiency of the third amplifying stage which includes the combination of the amplifying transistor Ta3 and power source E3 and which is switched into operation for an input voltage Vi in the range of V2 to Vcc. As seen from the graph of FIG. 6B, the efficiency of the amplifier circuit for a low level input signal Vi is further improved as compared to the amplifier circuit of FIG. 5A.

It will be understood that the efficiency of the basic amplifier circuit of the present invention may be further improved by adding further amplifying stages as indicated in the discussion of FIGS. 2A, 2B and 3A, 3B and FIGS. 5A, 5B and 6A, 6B. Additional amplifying stages which are automatically switchably selected may be constructed by increasing the number of the transistor and power source combinations and the efficiency of the overall amplifier circuit will be further improved as the number of amplifying stages is increased.

Figure 7:
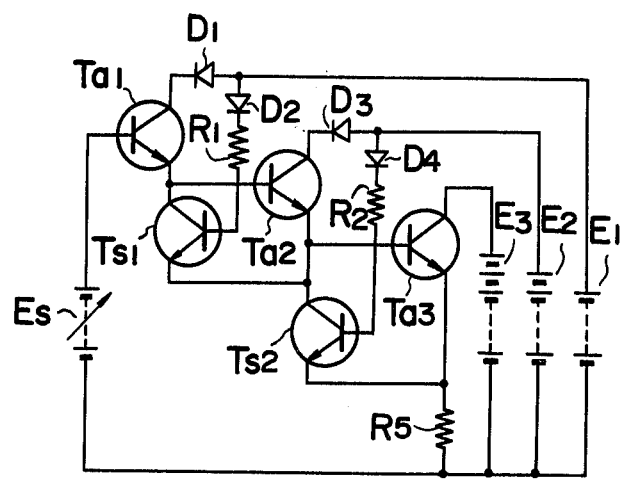
FIG. 7 is a circuit diagram of a modification of the circuit of FIG. 6A.

FIG. 7 illustrates another modification of the amplifier circuit embodiment of FIG. 5A. The distinguishing feature of this modification as compared to that in FIG. 6A is that the emitter of the transistor Ts1 is connected to the collector of the transistor Ts2 which also is connected to the emitter of the transistor Ta2 and the base of the transistor Ta3. In operation, when the input signal Vi is lower than the voltage V1 of the first power source E1, the transistor Ta1 acts as an amplifying element, providing output current through the load resistor R5 from the first power source E1 through the diode D1 and through collector to emitter circuits of the transistors Ta1, Ts1 and Ts2. In this mode of operation, the transistor Ta2 and the transistor Ta3 are in the off (i.e., non-conductive) condition. When the input signal voltage Vi is in a range between the voltages V1 and V2, the transistor Ta2 operates as the amplifying element, providing output current through the load resistor R5 from the second power source E2 through the diode D3 and through the collector to emitter circuits of the transistors Ta2 and Ts2. In this mode of operation, the transistor Ts1 is non-conductive and the transistor Ta1 operates as a unidirectional element. Similarly, when the input signal voltage V1 is in the range between the voltages V2 and Vcc, the transistor Ta3 operates as an amplifying element, providing output current through the load resistor R5 from the third power source E3 through the collector to emitter circuit of the transistor Ta3. In this mode of operation, the transistors Ts1 and Ts2 are non-conductive and the transistors Ta1 and Ta2 each operate as a unidirectional element.

Figure 8:
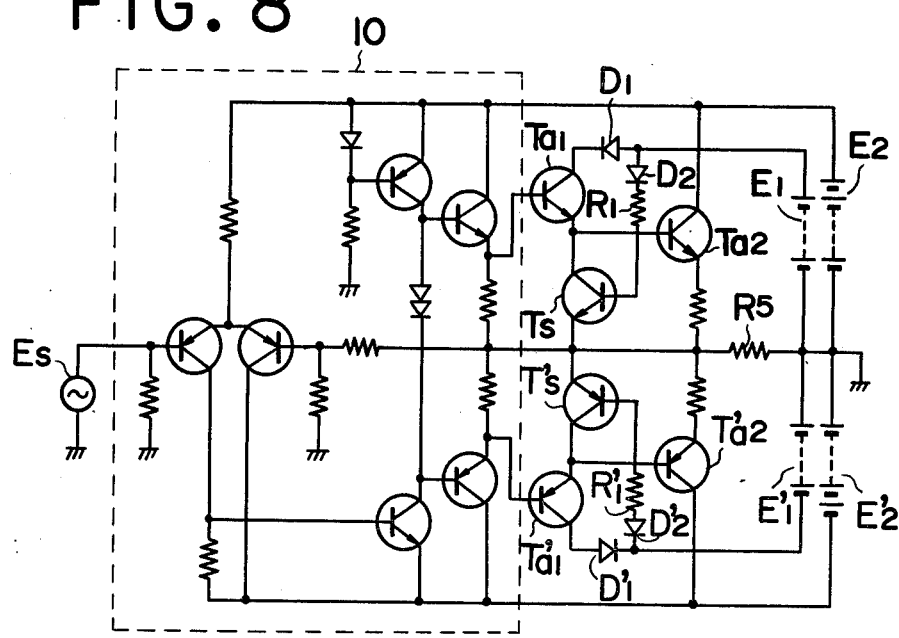
FIG. 8 is a circuit diagram of another embodiment of the circuit of FIG. 5A.

FIG. 8 shows a further modification of the amplifier circuit of FIG. 5A in which the basic amplifier circuit of FIG. 5A is used in an overall push-pull amplifier circuit. In FIG. 8 the reference numeral 10 designates generally a conventional drive circuit for driving the push-pull amplifier circuit of the present invention. The corresponding components in the respective symmetrical amplifier circuits are distinguished from each other by dashed reference characters as in the push-pull amplifier embodiment illustrated in FIG. 4. In view of the discussion of the embodiment in FIG. 4, the features, advantages and operations of the push-pull circuit of FIG. 8 will be apparent to those skilled in the art without further detailed explanation.

As seen from the foregoing, the respective amplifying stages, each including an amplifying transistor and an associated power source, are arranged in parallel with respect to a single load, and each amplifying stage is automatically switchably selected depending on the input signal voltage. This maximizes the efficiency of operation and minimizes heat generation. Also, it is possible to use transistors with relatively small current capacities for the amplifying transistors of the respective amplifying stages except for the last amplifying stage. The efficiency of the amplifier circuit is remarkably improved, the excessive heat generation problem is eliminated, and design for heat dissipation is made easy.

What is claimed is:

1. An amplifier circuit comprising:
an input means adapted to be connected to an input signal to be amplified;
at least two sets of combined amplifying elements and associated power sources, one of said sets constituting a first amplifying stage and another constituting a second amplifying stage; each of said amplifying stages being adapted to amplify an input signal connected to said input means;
switching means comprising transistors connected between said input means and each of said amplifying elements for switching the amplifying operation of the amplifier circuit from one of said amplifying stages to another of said amplifying stages in accordance with a predetermined amplitude for the input signal;
a load to which each of said amplifying stages is connected in parallel; and
wherein the voltage of the power source of said first amplifying stage is lower than the voltage of the power source of said second amplifying stage, said first amplifying stage operates to provide electrical energy to said load when the input signal is lower than the voltage of the power source of said first stage, and said second stage operates to provide electrical energy to said load when the input signal is higher than the voltage of the power source of said first stage but lower than the voltage of the power source of said second stage.

2. An amplifier circuit comprising:
an input means adapted to be connected to an input signal to be amplified;
at least two sets of combined amplifying elements and associated power sources, one of said sets constituting a first amplifying stage and another constituting a second amplifying stage; each of said amplifying stages being adapted to amplify an input signal connected to said input means;
a load to which each of said amplifying stages is connected in parallel;
switching means comprising a transistor connected between said first amplifying stage and said load for switching the amplifying operation of the amplifier circuit from one of said amplifying stages to another of said amplifying stages in accordance with a predetermined amplitude for the input signal; and
wherein the voltage of the power source of said first amplifying stage is lower than the voltage of the power source of said second amplifying stage; said first amplifying stage operates to provide electrical energy to said load when the input signal is lower than the voltage of the power source of said first stage; and said second stage operates to provide electrical energy to said load when the input signal is higher than the voltage of the power source of said first stage; and said second stage operates to provide electrical energy to said load when the input signal is higher than the voltage of the power source of said first stage but lower than the voltage of the power source of said second stage.

3. An amplifier circuit comprising:
an input having two terminals adapted to receive an input signal to be amplified;
a first amplifying stage including first and second active elements each with first, second and third terminals and a first power source having two terminals, said first power source being connected to said first terminal of said first active element and to said second terminal of said second active element, the first terminal of said input being connected to said second terminal of said first active element, said third terminal of said first active element being connected to said first terminal of said second active element;
a second amplifying stage including third and fourth active elements each with first, second and third terminals and a second power source having two terminals, said first terminal of said third active element being connected to said first power source, said third terminal of said third active element being connected to the first terminal of said input, said second terminal of said third active element being connected to said first terminal of said fourth active element, said second terminal of said fourth active element being connected to said second power source;

a load having two terminals, the first terminal of which is connected to said third terminal of said second and fourth active elements; and wherein the second terminal of said input, the second terminal of said load, and one terminal of said first power source and one terminal of said second power source are all commonly connected; wherein said first active element serves as a switching element for driving said second active element which serves as an amplifying element, and said third active element serves as a switching element for driving said fourth active element which serves as an amplifying element; and wherein said first and second active elements are switched depending upon the amplitude of the input signal at said input relative to the electrical characteristics of said first and second power sources.

4. An amplifier circuit according to claim 3 wherein a unidirectional element is inserted between said first terminal of said first active element and said first power source and wherein a unidirectional element is inserted between said second terminal of said second active element and said first power source.

5. An amplifier circuit according to claim 4 wherein a unidirectional element is inserted between said second terminal of said third active element and said second power source.

6. An amplifier circuit according to claim 3 wherein an impedance means is inserted between said first terminal of said first active element and said first power source.

7. An amplifier circuit according to claim 3 comprising:

a second input having two terminals adapted to receive an input signal to be amplified, the signal to be provided to said second input being related to the signal being provided on said input; and wherein said first amplifying stage further includes fifth and sixth active elements each with first, second and third terminals, said active elements being opposite in conductivity to said first and second active elements, and a third power source having two terminals and being opposite in polarity to said first power source, said third power source being connected to said first terminal of said fifth active element, the first terminal of said second input being connected to said second terminal of said fifth active element, and said third terminal of said fifth active element being connected to said first terminal of said sixth active element; and wherein said second amplifying stage includes seventh and eighth active elements each with first, second and third terminals, said active elements being opposite in conductivity to said third and fourth active elements, and a fourth power source having two terminals and being opposite in polarity to said second power source, said third power source being connected to said first terminal of said seventh active element, the first terminal of said second input being connected to said third terminal of said seventh active element, and said second terminal of said seventh active element being connected to said first terminal of said eighth element, said second terminal of said eighth active element being connected to one end of said fourth power source; and wherein the first terminal of said load is connected to said third terminals of said sixth and eighth active elements and the second terminal of said load is connected to one terminal of said third and fourth power sources; and wherein said fifth active element serves as a switching element for driving said sixth element which serves as an amplifying element; wherein said seventh active element serves as a switching element for driving said eighth element which serves as an amplifying element, wherein said fifth and seventh active elements are switched depending upon the amplitude of the second input signal at said second input relative electrical characteristics of said third and fourth power sources; and wherein said first terminals of said first and fifth active elements are connected to said power sources through unidirectional elements.

8. An amplifier circuit comprising:

an input having two terminals adapted to receive an input signal to be amplified;

a first amplifying stage including first and second active elements each with first, second and third terminals and a first power source having two terminals, the first terminal of said first active element being connected to the first terminal of said input, the second terminal of said first active element being connected to said first power source, and the third terminal of said first active element being connected to the second terminal of said second active element, the first terminal of said second active element being connected to said first power source through an impedance means;

a second amplifying stage including a third active element with first, second and third terminals, and a second power source having two terminals, the first terminal of said third active element being connected to the third and second terminals of said first and second active elements, and the second terminal of said third active element being connected to said second power source; and a load having two terminals, the first terminal of which is connected to the third terminals of said second and third active elements; and wherein the second terminal of said load is connected commonly to the second terminal of said input, and to one terminal of said first and second power sources.

9. An amplifier circuit according to claim 8, wherein a unidirectional element is inserted between the second terminal of said first active element and said first power source, and wherein a unidirectional element is inserted between the first terminal of said second active element and said first power source.

10. An amplifier circuit according to claim 8 wherein a unidirectional element is inserted between the second terminal of said third active element and said second power source.

11. An amplifier circuit according to claim 8 comprising:

a second input having two terminals adapted to receive an input signal to be amplified, the signal to be provided on said input; and wherein said first amplifying stage includes fourth and fifth active elements each with first, second and third terminals, said fourth and fifth active elements being opposite in conductivity to said first and second active elements, and a third power source having two terminals and being opposite in polarity to said first power source, the first terminal of said fourth active element being connected to the first terminal of said second input, the second terminal of said fourth active element being connected to said third power source, the third terminal of said fourth active element being connected to the second terminal of said fifth active element, the first terminal of said fifth active element being connected to said third power source through an impedance means; and wherein said second amplifying stage includes a sixth active element with first, second and third terminals and being opposite in conductivity to said third active element, and a fourth power source having two terminals and being opposite in polarity to said second power source, the first terminal of said sixth active element being connected to the second and third terminals of said fifth and fourth active elements, the second terminal of said sixth active element being connected to said fourth power source;

wherein the first terminal of said load is connected to the second terminals of said fifth and sixth active elements; wherein said fourth active element serves as a switching element for driving said fifth active element which serves as an amplifying element and;

wherein said sixth active element serves as an amplifying element; wherein said fourth active element is switched depending upon the amplitude of the second input signal at said second input relative to the electrical characteristics of said third and fourth power sources; and wherein one terminal of said third and fourth power sources are connected to the second terminal of said load.

* * * * *